United States Patent
Houston

(10) Patent No.: US 7,821,843 B2
(45) Date of Patent: Oct. 26, 2010

(54) PARTIAL WRITE-BACK IN READ AND WRITE-BACK OF A MEMORY

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 85 days.

(21) Appl. No.: 12/399,808

(22) Filed: Mar. 6, 2009

(65) Prior Publication Data

US 2010/0226186 A1 Sep. 9, 2010

(51) Int. Cl.
*G11C 7/00* (2006.01)
(52) U.S. Cl. .......................... 365/189.011; 365/185.22
(58) Field of Classification Search .......... 365/189.011, 365/185.22
See application file for complete search history.

(56) References Cited

U.S. PATENT DOCUMENTS

2004/0183808 A1 * 9/2004 Radke et al. ................ 345/558
2005/0128789 A1 * 6/2005 Houston ..................... 365/154

* cited by examiner

*Primary Examiner*—Michael T Tran
(74) *Attorney, Agent, or Firm*—Rose Alyssa Keagy; W. James Brady; Frederick J. Telecky, Jr.

(57) ABSTRACT

An integrated circuit having a functional memory and methods of operating and reducing an operating power of the integrated circuit are provided. The functional memory includes an array of memory cells connected to row and column periphery units and organized in corresponding rows and columns. The memory also includes a word line that provides row access to a memory cell. The memory further includes at least one bit line that provides column access to the memory cell. The memory still further includes a partial write-back module, connected to the at least one bit line, that establishes a bit line bias to maintain a current state of the memory cell when in a half-selected condition based on a read of the current state and during a write cycle to a selected memory cell in the array.

20 Claims, 5 Drawing Sheets

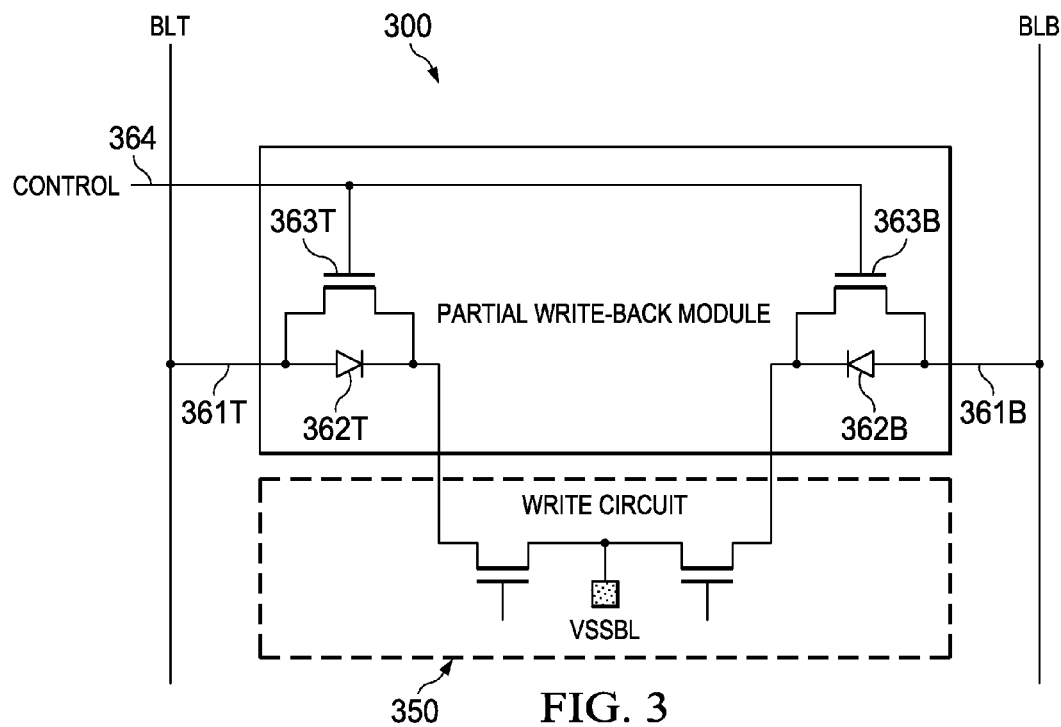
FIG. 3
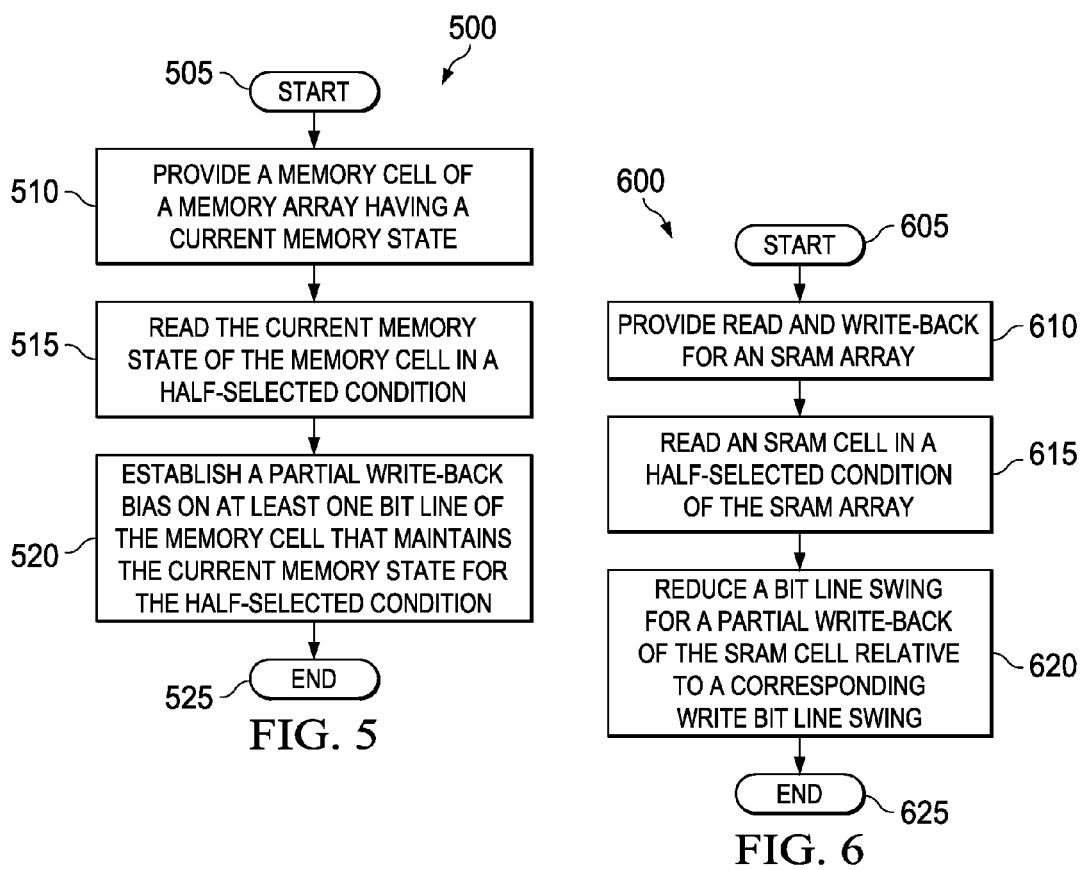
FIG. 5
FIG. 6

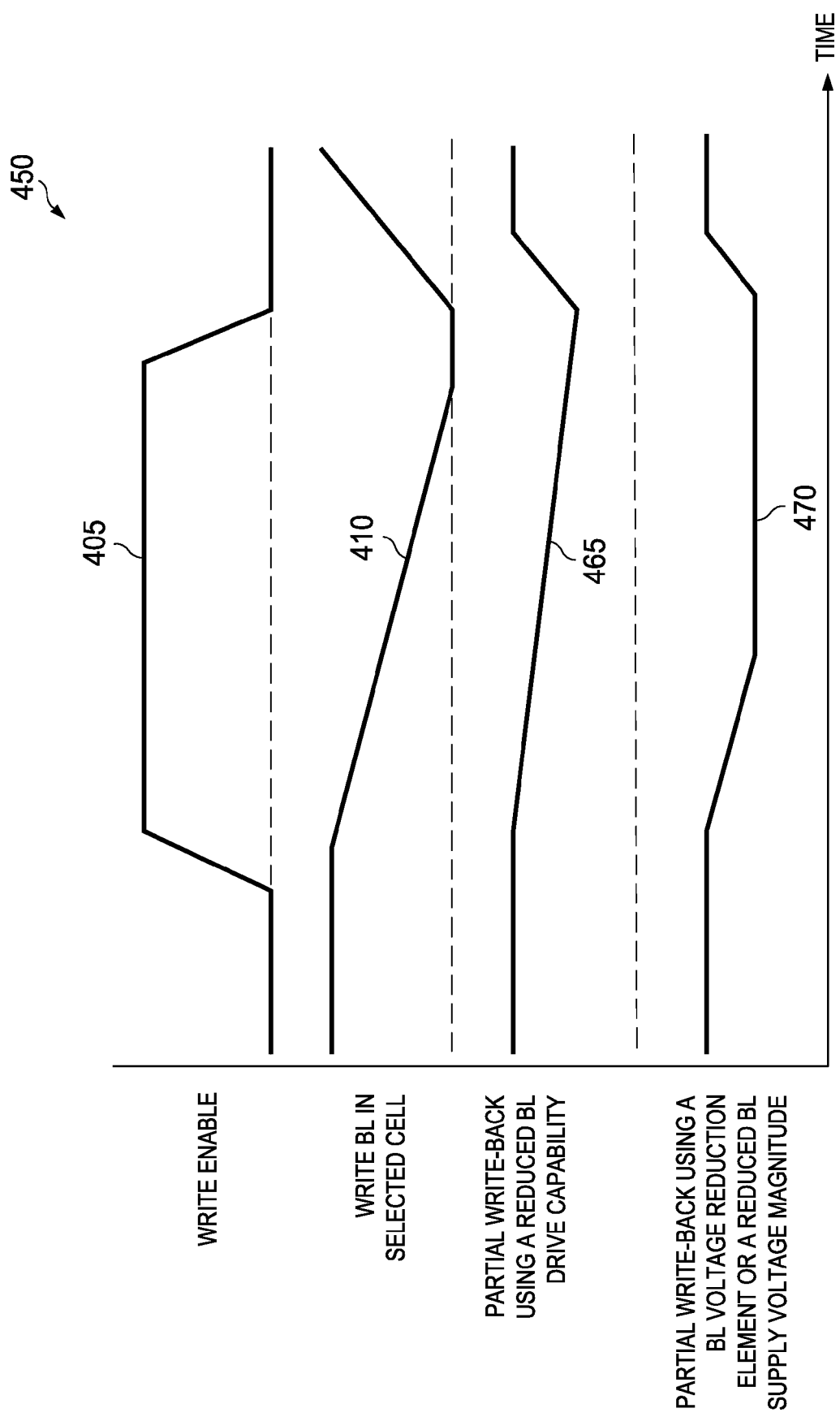

US 7,821,843 B2

PARTIAL WRITE-BACK IN READ AND WRITE-BACK OF A MEMORY

TECHNICAL FIELD

This application is directed, in general, to an integrated circuit and, more specifically, to an integrated circuit including a functional memory, a method of operating an integrated circuit having a memory array and a method for reducing an operating power of an integrated circuit having an SRAM array.

BACKGROUND

A typical SRAM device is designed to store many thousands of bits of information. These bits are stored in individual cells, organized in an array of rows and columns to make efficient use of space on a semiconductor substrate containing the SRAM device. A commonly used cell architecture is known as the "6T" cell, by virtue of having six MOS transistors. Four transistors defining an SRAM cell core or memory element are configured as cross-coupled CMOS inverters, which act as a bistable circuit that can indefinitely hold a memory state imposed on it while powered. Each CMOS inverter includes a load or "pull-up" transistor and a driver or "pull-down" transistor. The outputs of the two inverters will be in opposite states, except during transitions from one state to another.

Two additional transistors are known as pass gate transistors, which provide access to the cross-coupled inverters during a read operation or a write operation. The gate inputs of the pass gate transistors are typically commonly connected to a word line for row access. The pass gate transistors are used to respectively connect each side of the memory element to a "true" bit line BLT and its complement (or "bar") bit line BLB for column access. In SRAMs having interleaved words in a row, half-selected cells (non-selected columns in a selected row) are subject to upset when fully selected cells are being written. This can limit the assist given to writing into the cell (e.g., using a boosted word line signal for write).

Some SRAM cell architectures, such as an 8T SRAM cell architecture, include a read buffer that isolates the storage element during a read operation. Nevertheless, half-selected cells in a write cycle are subject to upset. Read and write-back is one approach that can be used to preserve the state of half-selected cells in a write cycle. However, using read and write-back often comes at the expense of considerable dynamic power. Improvements in this area would prove beneficial in the art.

SUMMARY

Embodiments of the present disclosure provide an integrated circuit that includes a functional memory, a method of operating an integrated circuit having a memory array and a method for reducing an operating power of an integrated circuit having an SRAM array. In one embodiment, the functional memory includes an array of memory cells connected to row and column periphery units that is organized in corresponding rows and columns. The functional memory also includes a word line connected between the row periphery unit and a memory cell of the array that is controlled by a word line driver to provide row access to the memory cell. The functional memory further includes at least one bit line connected between the column periphery unit and the memory cell that provides column access to the memory cell. The functional memory still further includes a partial write-back module that is connected to the at least one bit line to establish a bit line bias. This bit line bias maintains a current state of the memory cell when it is in a half-selected condition wherein the bit line bias is based on a read of the current state and occurs during a write cycle to a selected memory cell in the array.

In another aspect, the method of operating the integrated circuit having a memory array includes providing a memory cell of the memory array having a current memory state and reading the current memory state of the memory cell in a half-selected condition. The method also includes establishing a partial write-back bias on at least one bit line of the memory cell that maintains the current memory state for the half-selected condition.

In yet another aspect, the method for reducing an operating power of an integrated circuit having an SRAM array includes providing read and write-back for the SRAM array, reading an SRAM cell in a half-selected condition of the SRAM array and reducing a bit line swing for a partial write-back of the SRAM cell relative to a corresponding write bit line swing.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION

Reference is now made to the following descriptions taken in conjunction with the accompanying drawings, in which:

FIG. 3 illustrates a schematic diagram of an embodiment of a partial write-back module constructed according to the principles of the present disclosure;

FIGS. 4A and 4B illustrate waveforms for several embodiments of a partial write-back module constructed according to the principles of the present disclosure.

FIG. 5 illustrates a flow diagram of an embodiment of a method of operating an integrated circuit having a memory array carried out according to the principles of the present disclosure; and FIG. 6 illustrates a flow diagram of an embodiment of a method for reducing an operating power of an integrated circuit having an SRAM array carried out according to the principles of the present disclosure.

DETAILED DESCRIPTION

A common approach to resolve an upset of half-selected cells in a write mode (i.e., a "Write") is to do a read and write-back so that the pre-existing state is written back into the half-selected cells while the incoming data is written into the selected cells. One downside of this approach is that this requires a full swing of the bit lines in all the non-selected columns as well as in the selected columns, thereby increasing the active power for a Write. Also, the "data" for the non-selected columns may arrive late compared to the input data.

Embodiments of the present disclosure are based on recognition that it is not necessary to actually write into the half-selected cells. It is only necessary to prevent upset. That is, the "write-back" does not need to be able to flip a cell from one state to another, it just needs to keep the cell from flipping out of its initial state. While a full swing on a bit line may be needed to write into a cell (transition or flip from one state to the other state), a smaller differential between the bit lines in the direction of the initial state will prevent upset.

Imposing a reduced swing on the bit lines of the non-selected columns will prevent upset and use less dynamic power than imposing a full swing. The reduced swing can be accomplished in various ways, including a timed pulse or by pulling down a precharged bit line through a diode. For the latter approach, a diode (or some other voltage reduction element) may be placed in parallel with a switch between a write driver and the bit line. The switch can be turned on for selected columns and off for non-selected columns. These embodiments provide lower power usage and also less delay for the write-back in those cases where extra time would have been allocated to allow a full bit line swing with the read data.

Figure 1:
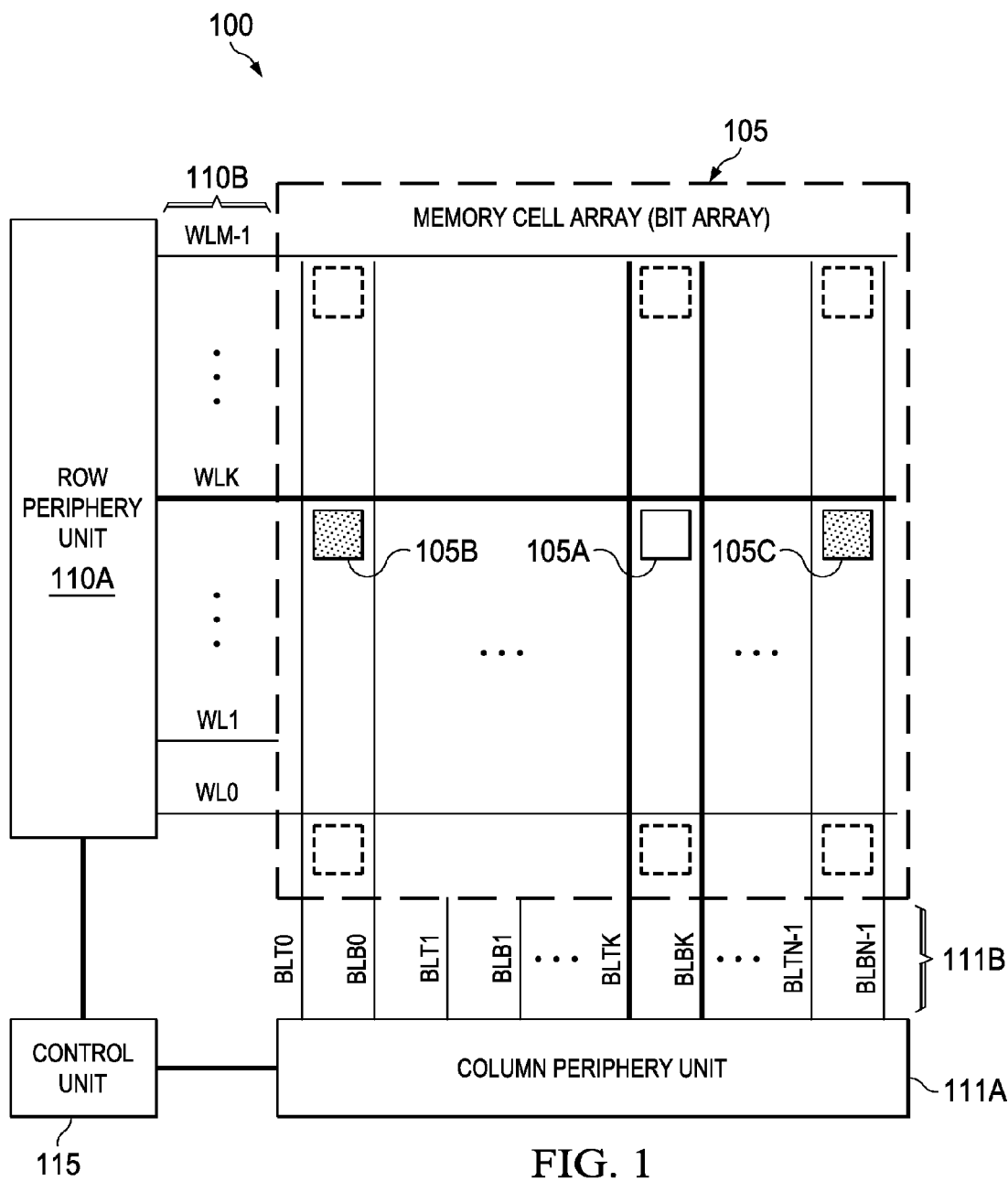
FIG. 1 illustrates a block diagram of an integrated circuit that includes a functional static random access memory (SRAM) having a partial write-back module constructed according to the principles of the present disclosure.

FIG. 1 illustrates a block diagram of an integrated circuit that includes a functional static random access memory (SRAM), generally designated 100, employing a partial write-back module constructed according to the principles of the present disclosure. In general, embodiments of the functional SRAM 100 may be included in the integrated circuit as an embedded memory connected to other portions of the integrated circuit. Alternatively, the functional SRAM 100 may be a discrete memory contained in the integrated circuit.

The functional SRAM 100 includes an array of memory cells 105, a row periphery unit 110A, a column periphery unit 111A and a control unit 115. The array of memory cells 105 is organized in corresponding rows and columns, as shown. The array of memory cells 105 is connected to the row periphery unit 110A by M word lines 110B (i.e., WL0 through WLM-1). Each of the M word lines 110B is controlled by a word line driver to provide access to a row of memory cells in the array 105. The array of memory cells 105 is also connected to the column periphery unit 111A by N pairs of bit lines 111B (i.e., BLT0, BLB0 through BLTN-1, BLBN-1). Each of the N pairs of bit lines 111B provides access to a column of memory cells in the array 105. The control unit 115 is connected to the row and column periphery units 110A, 111A and controls their respective operations.

In the illustrated example, a word line WLK and a pair of bit lines BLTK, BLBK are selected. This action places a memory cell 105A in a selected condition. Correspondingly, this action also places memory cells 105B and 105C in a half-selected condition, since bit line pairs BLT0, BLB0 and BLTN-1, BLBN-1 are not selected. Embodiments of a partial write-back module may be employed with the half-selected memory cells 105B, 105C to establish a bit line bias on their respective bit lines, which maintains respective current states of the memory cells 105B, 105C. This bit line bias is based on a read of the current state and occurs during a write operation or write cycle to the selected memory cell 105A.

The term "read" may be taken to mean a sensing of the state of the cell and not necessarily including an output from the cell as would occur in a read cycle.

The term "partial write-back" refers to placing a bias on at least one of the bit lines associated with each of the half-selected memory cells. This bit line bias (which may be in the form of a voltage, for example) causes its corresponding half-selected cell to maintain or retain its current storage state thereby avoiding or overriding any tendency for the memory cell to upset. Typically, with partial write-back to maintain the state of cells, there is a bigger difference between the bias to write a "ONE" and the bias to write a "ZERO" than the differential between the bias to retain a ONE and the bias to retain a ZERO.

Figure 2:
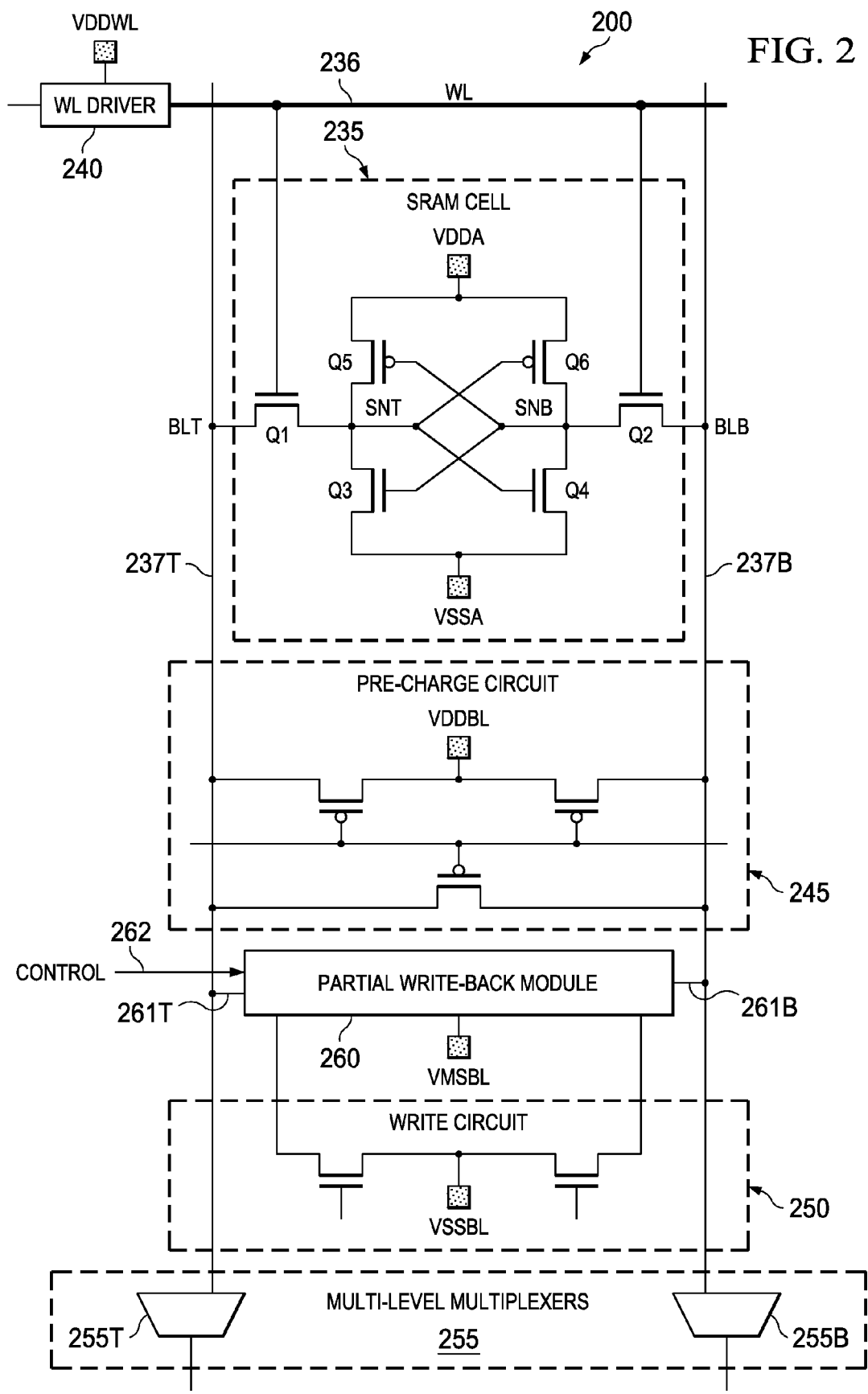
FIG. 2 illustrates a schematic diagram of an embodiment of a portion of a functional SRAM employing a partial write-back module as may be used in the functional SRAM 100 of FIG. 1.

FIG. 2 illustrates a schematic diagram of an embodiment of a portion of a functional SRAM, generally designated 200, employing a partial write-back module as may be employed in the functional SRAM 100 of FIG. 1. The portion of the functional SRAM 200 includes an SRAM memory cell 235, a word line driver 240 in a row periphery unit (not shown) connected to a word line 236 (generally designated WL) of the SRAM memory cell 235, a pre-charge circuit 245 and a write circuit 250 in a column periphery unit (not shown) connected to a pair of bit lines 237T, 237B (generally designated BLT, BLB) for the SRAM memory cell 135. The portion of the functional SRAM 200 also includes multi-level multiplexers 255 having multiple levels of bit line multiplexers 255T, 255B. The portion of the functional SRAM 230 further includes a partial write-back module 260.

The SRAM cell 235 is typical of a six-transistor (6T) SRAM cell having left/right NMOS pass gate transistors Q1/Q2, left/right NMOS driver transistors Q3/Q4, and left/right PMOS load transistors Q5/Q6. The SRAM cell 235 provides two storage nodes SNT and SNB (T stands for True and B stands for Bar or complement) for storing a bit state. The pair of bit lines 237T, 237B (BLT, BLB) provide respective access to the two storage nodes SNT and SNB.

The word line 236 (WL) provides control of bit line access (enabling or disabling) of the SRAM cell 235 through the pair of bit lines BLT, BLB. The SRAM cell 235 is connected to an array sourcing voltage supply VDDA and an array sinking voltage supply VSSA. When the word line 236 is selected, a word line voltage is driven to a supply voltage VDDWL. Similarly, when the pre-charge circuit 245 is enabled, both the pair of bit lines 237T, 237B are driven (i.e., pre-charged) to a supply voltage VDDBL. When a bit is written, only one of the pair of bit lines 237T, 237B is driven to a write circuit supply voltage VSSBL.

The partial write-back module 260 is connected to the write circuit 250 and the pair of bit lines 237T, 237B with partial write-back module connections 261T, 261B, as shown. As generally noted before, the partial write-back module 260 establishes a bit line bias to maintain a current state of the memory cell 235 when it is in a half-selected condition. The current state is based on a read operation of the current state taken within a write cycle to a selected memory cell in the array. This read operation may be accomplished locally for the memory cell or globally for the array. The bit line bias causes the current state to be preserved during the write mode, thereby preventing cell upset.

In one embodiment, the partial write-back module 260 establishes a bit line bias that is a partial write-back pulse signal or swing on at least one of the bit lines 237T, 237B that is shorter in duration than a corresponding write pulse signal or swing employed to write into the memory cell 235. Alternatively, the partial write-back module 260 may be connected to a partial write-back voltage supply VMSBL that is separate from the write circuit voltage supply VSSBL. In this case, the partial write-back voltage supply VMSBL is connected to provide a partial write-back supply voltage that causes a smaller bit line swing than would be caused by a corresponding write supply voltage of the write circuit voltage supply VSSBL.

FIG. 3 illustrates a schematic diagram of an embodiment of a partial write-back module, generally designated 300, constructed according to the principles of the present disclosure. The partial write-back module 300 includes first and second voltage reduction elements 362T, 362B that are respectively connected between a write circuit 350 and a corresponding bit line, as shown. In this embodiment, the voltage reduction element is a diode. This provides a partial write-back voltage for a bit line that causes a smaller bit line swing than would be caused by a corresponding write voltage to each bit line.

In this embodiment, each of the voltage reduction elements 362T, 362B are parallel connected to corresponding semiconductor switches 363T, 363B, as shown. The semiconductor switches 363T, 363B are connected to a control signal 364 that deactivates the semiconductor switches 363T, 363B when a memory cell is in a half-selected condition. The semiconductor switches 363T, 363B are activated to allow a normal write operation to the memory cell when it is in a selected condition. The control signal 364 may be provided by a control unit (such as the control unit 115 of FIG. 1, for example) or from a column periphery unit (such as the column periphery unit 111A of FIG. 1, for example).

Figure 4A:
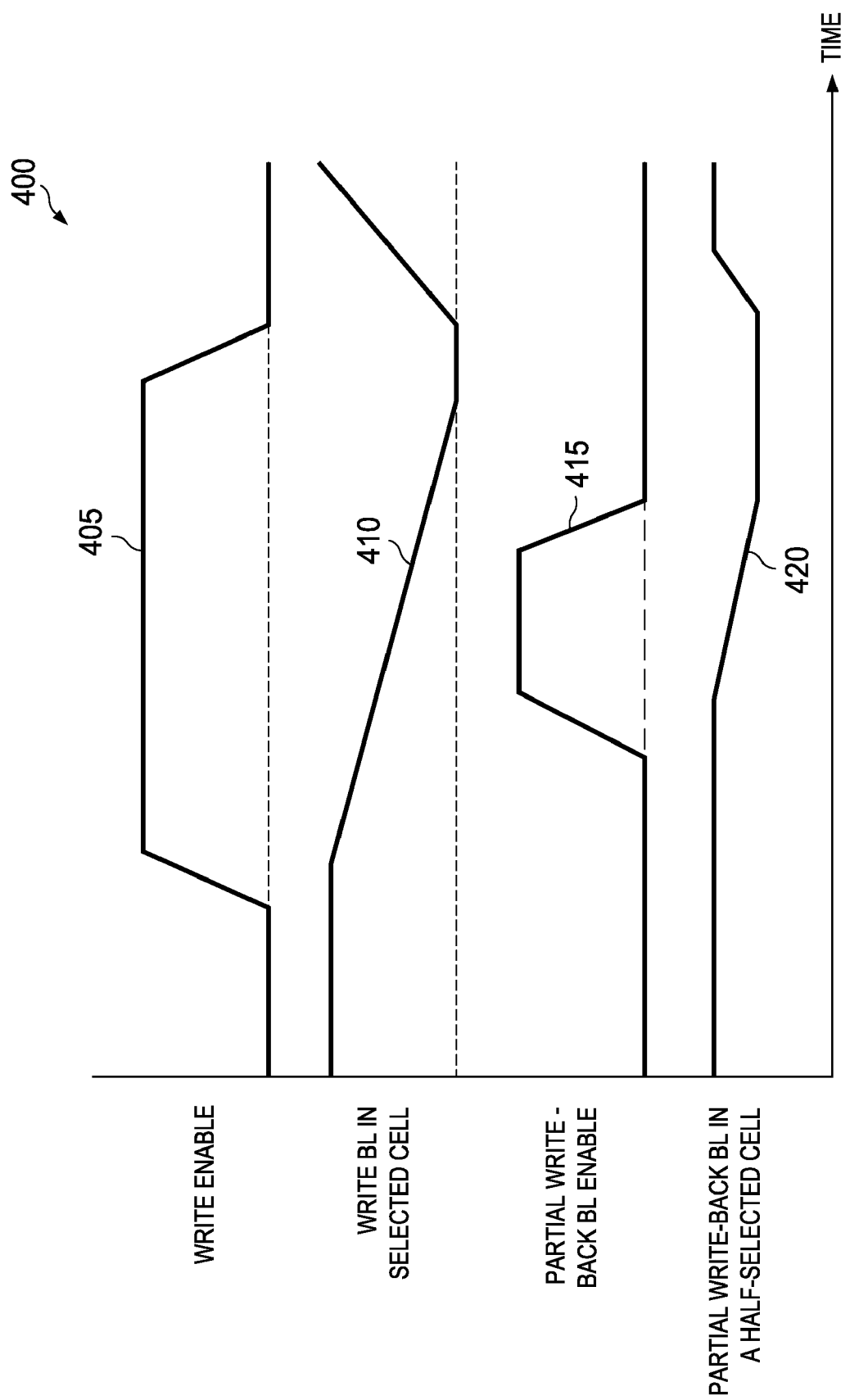

FIGS. 4A and 4B illustrate waveforms for several embodiments of a partial write-back module, generally designated 400 and 450, constructed according to the principles of the present disclosure. FIGS. 4A and 4B include a write enable waveform 405 and a write bit line waveform 410, which shows a bit line swing in a selected cell for comparison purposes.

FIG. 4A also includes a partial write-back bit line enable waveform 415, and a partial write-back bit line waveform 420, which shows a bit line swing in a half-selected cell. The partial write-back bit line enable waveform 415 may be seen to be both reduced in bit line enable duration and delayed when compared to the write enable waveform 405. Either of these conditions provides a reduced bit line swing in the half selected cell in the form of a shorter duration or a smaller magnitude than the write bit line waveform 410.

FIG. 4B also includes a partial write-back bit line waveform 465, which provides a reduced bit line swing for a half-selected cell that is based on a reduced bit line drive capability. The reduced bit line drive capability reduces the magnitude of a possible bit line change, since it typically is unable to move the bit line as far (corresponding to higher drive impedance) as a write condition for a fully selected cell.

FIG. 4B further includes a partial write-back bit line waveform 470, which provides a reduced bit line swing for a half-selected cell that is based on a voltage reduction element or a reduced bit line supply voltage magnitude. The partial write-back bit line waveforms 465, 470 are thereby smaller in magnitude than the write bit line waveform 410. Although smaller in magnitude, the partial write-back bit line waveforms 420, 465 and 470 are designed to provide sufficient bit line bias to prevent upset of a cell in a half-selected condition.

FIG. 5 illustrates a flow diagram of an embodiment of a method of operating an integrated circuit, generally designated 500, carried out according to the principles of the present disclosure. The method 500 is for use with a memory array in the integrated circuit and starts in a step 505. Then, in a step 510, a memory cell of the memory array is provided having a current memory state. The current memory state is read for the memory cell in a half-selected condition, in a step 515. A partial write-back bias is established on at least one bit line of the memory cell that maintains the current memory state for the half-selected condition, in a step 520.

In one embodiment, establishing the partial write-back bias maintains the current memory state during a write cycle to a selected memory cell in the memory array. Alternatively, establishing the partial write-back maintains the current memory state during a read and write-back cycle of the memory array.

In one embodiment, establishing the partial write-back bias corresponds to a local bit line swing for a memory array having local and global bit lines. In another embodiment, establishing the partial write-back bias employs a partial write-back bit line swing on the at least one bit line that is shorter in duration than a corresponding write bit line swing. In yet another embodiment, establishing the partial write-back bias employs a partial write-back bit line swing that is smaller in magnitude than a corresponding write bit line swing.

In still another embodiment, establishing the partial write-back bias provides a partial write-back bit line swing on the at least one bit line that is reduced relative to a corresponding write bit line swing based on reducing a bit line enable duration, reducing a bit line supply voltage magnitude or reducing a bit line drive capability. The method 500 ends in a step 525.

FIG. 6 illustrates a flow diagram of an embodiment of a method of reducing an operating power of an integrated circuit, generally designated 600, carried out according to the principles of the present disclosure. The method 600 is for use with an SRAM array in the integrated circuit and starts in a step 605. Then, in a step 610, read and write-back is provided for the SRAM array. An SRAM cell of the SRAM array in a half-selected condition is read, in a step 615. A bit line swing for a partial write-back of the SRAM cell is reduced relative to a corresponding write bit line swing of the SRAM cell, in a step 620.

In one embodiment, reducing the bit line swing for the partial write-back corresponds to a local bit line swing for an SRAM array having local and global bit lines. In another embodiment, reducing the bit line swing for the partial write-back provides a partial write-back bit line swing that is shorter in duration than a corresponding write bit line swing. In yet another embodiment, reducing the bit line swing for the partial write-back provides a partial write-back bit line swing that is smaller in magnitude than a corresponding write bit line swing. In still another embodiment, reducing the bit line swing is based on reducing a bit line enable duration, reducing a bit line supply voltage magnitude or reducing a bit line drive capability. The method 600 ends in a step 625.

Those skilled in the art to which this application relates will appreciate that other and further additions, deletions, substitutions and modifications may be made to the described embodiments. For example, embodiments of the present disclosure may be applied to other types of SRAM cells such as a five transistor (5T) SRAM (cross-coupled inverters with a single pass gate) or an 8T SRAM (a 6T SRAM cell with an additional 2T read buffer). Other write mechanisms such as inverters driving the bit lines or opposite polarities such as bit line precharge low may also be employed.

What is claimed is:

1. An integrated circuit including a functional memory, the functional memory comprising:
   an array of memory cells, connected to row and column periphery units, that is organized in corresponding rows and columns;
   a word line, connected between the row periphery unit and a memory cell of the array, that is controlled by a word line driver to provide row access to the memory cell;
   at least one bit line, connected between the column periphery unit and the memory cell, that provides column access to the memory cell; and a partial write-back module, connected to the at least one bit line, that establishes a bit line bias to maintain a current state of the memory cell when in a half-selected condition, the current state is based on a read of the current state taken during a write cycle to a selected memory cell in the array.

2. The integrated circuit as recited in claim 1 wherein the partial write-back module is connected to a portion of a write circuit of the functional memory.

3. The integrated circuit as recited in claim 1 wherein the partial write-back module is connected to provide a partial write-back bit line swing on the at least one bit line that is shorter in duration than a corresponding write bit line swing.

4. The integrated circuit as recited in claim 1 wherein the partial write-back module is connected to provide a partial write-back bit line swing on the at least one bit line that is smaller in magnitude than a corresponding write bit line swing.

5. The integrated circuit as recited in claim 1 wherein the partial write-back module is connected to provide a partial write-back bit line swing on the at least one bit line that is reduced relative to a corresponding write bit line swing based on one selected from the group consisting of:
   a reduced bit line enable duration;
   a reduced bit line supply voltage magnitude; and
   a reduced bit line drive capability.

6. The integrated circuit as recited in claim 1 wherein the partial write-back module includes a voltage reduction element connected between the at least one bit line and a write circuit connected to the array.

7. The integrated circuit as recited in claim 6 wherein the voltage reduction element is a diode.

8. The integrated circuit as recited in claim 1 wherein the partial write-back module includes a voltage reduction element in parallel with a semiconductor switch that is connected between the at least one bit line and a write circuit of the array.

9. The integrated circuit as recited in claim 8 wherein the semiconductor switch is connected to a control signal that deactivates the semiconductor switch when the memory cell is in the half-selected condition.

10. The integrated circuit as recited in claim 1 wherein the functional memory is connected to provide local and global bit lines and the partial write-back bias is established on one of the local bit lines to maintain the current state of the memory cell.

11. A method of operating an integrated circuit having a memory array, comprising:
   providing a memory cell of the memory array having a current memory state;
   reading the current memory state of the memory cell in a half-selected condition; and
   establishing a partial write-back bias on at least one bit line of the memory cell that maintains the current memory state for the half-selected condition.

12. The method as recited in claim 11 wherein establishing the partial write-back bias maintains the current memory state during a write cycle to a selected memory cell in the memory array.

13. The method as recited in claim 11 wherein establishing the partial write-back bias corresponds to a local bit line swing for a memory array having local and global bit lines.

14. The method as recited in claim 11 wherein establishing the partial write-back bias provides a partial write-back bit line swing on the at least one bit line that is shorter in duration than a corresponding write bit line swing.

15. The method as recited in claim 11 wherein establishing the partial write-back bias provides a partial write-back bit line swing on the at least one bit line that is smaller in magnitude than a corresponding write bit line swing.

16. The method as recited in claim 11 wherein establishing the partial write-back bias provides a partial write-back bit line swing on the at least one bit line that is reduced relative to a corresponding write bit line swing based on one selected from the group consisting of:
   reducing a bit line enable duration;
   reducing a bit line supply voltage magnitude; and
   reducing a bit line drive capability.

17. A method for reducing an operating power of an integrated circuit having an SRAM array, comprising:
   providing read and write-back for the SRAM array;
   reading an SRAM cell in a half-selected condition of the SRAM array; and
   reducing a bit line swing for a partial write-back of the SRAM cell relative to a corresponding write bit line swing.

18. The method as recited in claim 17 wherein reducing the bit line swing provides a shorter duration swing than the corresponding write bit line swing.

19. The method as recited in claim 17 wherein reducing the bit line swing provides a smaller magnitude swing than the corresponding write bit line swing.

20. The method as recited in claim 17 wherein reducing the bit line swing is based on one selected from the group consisting of:
   reducing a bit line enable duration;
   reducing a bit line supply voltage magnitude; and
   reducing a bit line drive capability.

* * * * *